United States Patent [19] [11] 4,074,008
Green [45] Feb. 14, 1978

[54] EPOXIDE RESINS
[75] Inventor: George Edward Green, Cambridge, England
[73] Assignee: Ciba-Geigy Corporation, Ardsley, N.Y.
[21] Appl. No.: 711,325
[22] Filed: Aug. 3, 1976
[30] Foreign Application Priority Data
Aug. 13, 1975 United Kingdom ............. 33678/75
[51] Int. Cl.² .......................... C08F 2/46; G03C 1/68; C23F 1/02; C08F 4/00
[52] U.S. Cl. ..................................... 428/418; 96/35.1; 96/36.2; 96/86 P; 96/115 P; 156/634; 156/659; 156/901; 156/904; 204/159.23; 427/96; 526/273
[58] Field of Search ..................... 96/35.1, 114, 115 P, 96/86 P, 36.2, 36.3; 526/273; 427/43, 96; 204/159.15, 159.22, 159.23; 156/634, 656, 659, 901, 902, 904; 174/68.5; 428/413–418

[56] References Cited
U.S. PATENT DOCUMENTS

| | | | |
|---|---|---|---|
| 3,885,060 | 5/1975 | Hirai et al. | 427/43 |
| 3,956,043 | 5/1976 | Zahir et al. | 96/35.1 X |
| 3,996,121 | 12/1976 | Green et al. | 96/35.1 X |

Primary Examiner—William A. Powell
Attorney, Agent, or Firm—Vincent J. Cavalieri

[57] ABSTRACT

Epoxide resins, which polymerize on exposure to actinic radiation, have, per average molecule, at least two photopolymerizable groups and also at least two 1,2-epoxide groups, one or more such epoxide groups being contained in units of formula

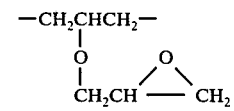

Photopolymerizable epoxide resins are commonly prepared by introduction of photopolymerizable groups into a molecule of an epoxide resin by reaction with some of the epoxide groups: the modified resin, having a low epoxide group content, usually exhibits poorer adhesion and lower glass transition temperature than would otherwise be the case. In the new resins, secondary hydroxyl groups generated on introduction of the photopolymerizable groups have been converted into glycidyl ether groups, thus they have a higher epoxide content.

35 Claims, No Drawings

EPOXIDE RESINS

DETAILED DISCLOSURE

This invention relates to novel epoxide resins which polymerise on exposure to actinic radiation and which can be subsequently crosslinked by means of heat-curing agents, to methods for their preparation, to methods of polymerising such resins by means of actinic radiation and then crosslinking them by means of heat-curing agents for epoxide resins, and to supports bearing thereon such a resin in the polymerisable state, in the photopolymerised but still crosslinkable state, or in the photopolymerised and heat-crosslinked state.

Substances capable of being polymerised on exposure to actinic radiation are well known and are used in the preparation of printing plates and of printed circuits. Whilst these are satisfactory for most purposes, they have serious drawbacks when used in the preparation of multilayer printed circuits.

A multilayer printed circuit is prepared from a number of double-sided printed circuit boards of copper, stacked one on top of another and separated from each other by insulating sheets, usually of glass fibre impregnated with a B-stage resin. The stack is heated and compressed to bond the layers together. Conventional photopolymerisable materials, however, do not form strong bonds either with copper or with resin-impregnated glass fibre sheets. A stack which is bonded with the photopolymer still covering the copper is therefore inherently weak and in use can become delaminated. It is therefore normal practice to remove the photopolymer after the etching stage, either by means of powerful solvents or by a mechanical method, e.g., by means of brushes. Such a stripping process can damage the copper of the printed circuit or the surface of the laminate on which the circuit rests, and so methods have been sought which would avoid the necessity of removing the photopolymerised material prior to bonding the boards together.

The use of photopolymerisable epoxide resins (containing a latent curing agent for the epoxide groups) has shown great promise in this respect, since the epoxide groups will crosslink when the boards are bonded, resulting in good adhesion to the copper and to the resin impregnated glass-fibre substrate. However, the known photopolymerisable epoxide resins are not entirely satisfactory since, in all cases, the photopolymerisable groups have been introduced into the molecule by reaction with some of the epoxide groups, and the epoxide content of the final product is therefore low. This low content of epoxide groups results in poorer adhesion and lower glass transition temperatures than would otherwise be the case.

There is therefore a need for a photopolymerisable epoxide resin which has a higher epoxide group content than those known in the art, which can be made simply, and which is suitable for use in the preparation of multilayer printed circuits.

We have now found that these requirements may be at least substantially met by means of certain photopolymerisable resins which have a glycidyl ether group attached to a secondary carbon atom. Such resins have a high glass transition temperature when thermally cured and so give multilayer packages which are more resistant to any thermal stresses occurring in use than are those prepared with conventional photopolymerisable epoxide resins. Further, they have a lower viscosity than the photopolymerisable resins which have hydroxyl groups rather than glycidyl ether groups attached to secondary carbon atoms, and so the new resins are particularly easy to apply, especially by roller coating.

Accordingly, one aspect of this invention provides epoxide resins which polymerise on exposure to actinic radiation, having, per average molecule, at least two, and preferably three or more, photopolymerisable groups and also at least two 1,2-epoxide groups, one or more such epoxide groups being contained in units of formula

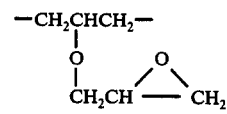

By "photopolymerisable groups" we do not include epoxide groups.

Preferred such epoxide resins are those having an average molecular weight of from 500 to 10,000, especially of from 1000 to 5000, and preferably the units of formula I are linked to carbon atoms in the remainder of the molecule through oxygen, nitrogen, or sulphur atoms.

One class of further preferred such epoxide resins are those containing, as the photopolymerisable groups, groups of the formula

where
R represents a hydrogen atom or an aliphatic, aromatic, araliphatic, or heterocyclic group of 1 to 12 carbon atoms, and
$R^1$ represents a hydrogen, chlorine, or bromine atom, an alkyl group of 1 to 4 carbon atoms, or a cyano group.

Yet further preferred are the resins containing groups of formula II where the group R contains ethylenic unsaturation or aromaticity in conjugation with the indicated ethylenic double bond, specific examples of groups of formula II being those of the formulae

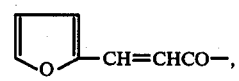 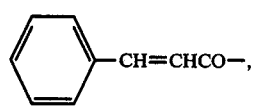

III IV

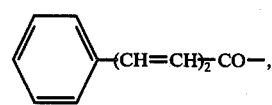 

V VI

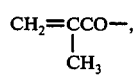 

VII VIII $$\left\langle \underset{N}{\overline{\phantom{xx}}}\right\rangle-CH=CHCO- \text{ and } \left\langle \underset{N}{\overline{\phantom{xx}}}\right\rangle-CH=CHCO-$$

IX             X

The groups of formula II are preferably directly attached to oxygen atoms or nitrogen atoms.

A particularly suitable subclass of epoxide resins containing groups of formula II are those which are of the formula $$\left[ R-CH=\underset{R^1}{\overset{|}{C}}-CO-OCH_2\underset{OX}{\overset{|}{CH}}CH_2 \right]_a - R^2 \qquad XI$$

where

R and $R^1$ are as defined above, $R^2$ represents the residue of a polyglycidyl compound after removal of glycidyl groups directly attached to oxygen, nitrogen, or sulphur atoms, the said residue being linked through oxygen, nitrogen, or sulphur atoms thereof to the indicated groups, $a$ represents an integer of at least 2, and X represents a hydrogen atom or a glycidyl group, such that at least one group X is a glycidyl group, there being, as already indicated, at least two 1,2-epoxide groups in the epoxide resin.

Further preferred resins are those of formula XI where $a$ is from 3 to 10 and each X is a glycidyl group.

The group $R^2$ is preferably linked to the other indicated groups through ether oxygen atoms, especially aromatic ether oxygen atoms, $R^2$ thus representing the residue, after removal of the hydrogen atoms in $a$ phenolic hydroxy groups, of a phenol, such as the residue of 2,2-bis(4-hydroxyphenyl)propane, bis(4-hydroxyphenyl)methane, a novolak formed from formaldehyde and phenol (which may be substituted in the ring by one or more alkyl groups of 1 to 9 carbon atoms or by one or more chlorine atoms) or of 1,1,2,2-tetrakis(p-hydroxyphenyl)ethane.

Or the group $R^2$ may be linked to the other indicated groups through amidic nitrogen atoms, particularly those of a cyclic urea, such as of an alkyleneurea, isocyanuric acid, or especially those of a hydantoin.

The second main class of preferred such photopolymerisable epoxide resins are those containing, as the photopolymerisable groups, chalcone-like groups of the formula

XII

XIII

XIV

XV the units of formulae XII to XV being linked by one indicated free valency through an oxygen atom to a carbon atom and by the other free valency either through another oxygen atom to another carbon atom or direct to a hydrogen atom, where each $R^3$ is a halogen atom or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing up to 9 carbon atoms, a nitro group, or a carboxyl, sulphonic, or phosphoric acid group in the form of a salt, $b$ represents zero or an integer of 1 to 4, $c$ represents zero or an integer of 1 to 5, $d$ represents zero or an integer of 1 to 3, Y represents a chain of carbon atoms containing in that chain a grouping of formula $$\left[ CH=\underset{R^4}{\overset{|}{C}} \right]_e \overset{O}{\underset{\|}{C}} \left[ \underset{R^5}{\overset{|}{C}}=CH \right]_f \qquad XVI$$

or

XVII or

XVIII $R^4$ and $R^5$ are each individually a hydrogen atom, an alkyl group, such as one of 1 to 9 carbon atoms, or an aryl group, such as one of 6 to 10 carbon atoms, or $R^4$ and $R^5$ conjointly denote a polymethylene chain of 2 to 4 methylene groups, $R^6$ and $R^7$ are each a hydrogen atom, an alkyl group, such as one of 1 to 9 carbon atoms, or an aryl group, such as one of 6 to 10 carbon atoms, $e$ and $f$ are each zero, 1, or 2, with the proviso that they are not both zero, and Z is an oxygen or sulphur atom.

Specific examples of preferred units of formula XII to XV are those of the formula

XIX

XX

XXI

-continued

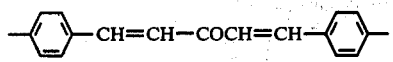 XXII

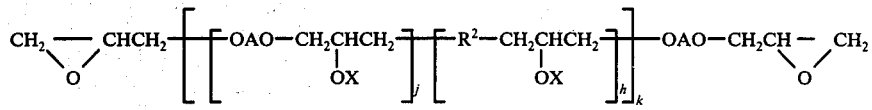 XXV or

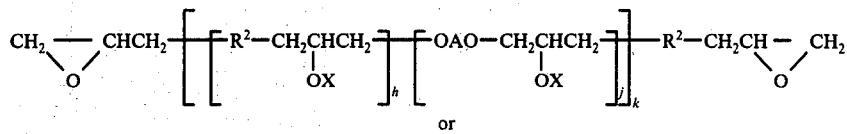 XXVI

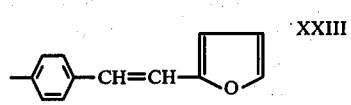 XXIII the units being linked by the indicated free valencies or valency through oxygen atoms or an oxygen atom to carbon atoms or a carbon atom.

Other preferred subclasses of epoxide resins containing a group of any of formulae XII to XV comprise those of the formulae where
$R^2$, A, and X have the meanings previously assigned,
h is zero or a positive integer, and
j and k are each an integer of one or more,
h, j, and k being such that the average molecular weight of the epoxide resin is from 500 to 10,000.

Other suitable subclasses of epoxide resins are those of the formulae

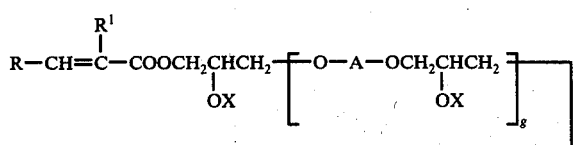 XXVII or

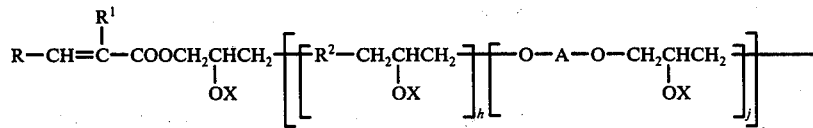 XXVIII or

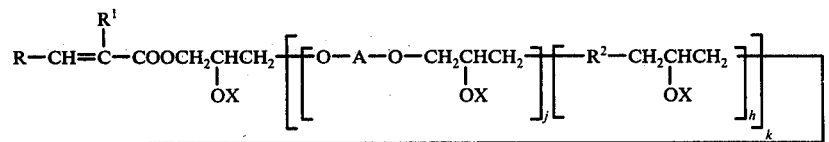 XXIX

One preferred subclass of epoxide resins containing a group of any of formulae XII to XV comprises those which are of the formula

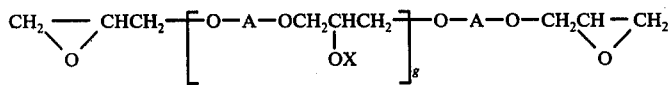 XXIV where
A denotes a group of any of formulae XII to XV,
X has the meaning previously assigned, and
g is a positive integer of average value such that the average molecular weight of the epoxide resin is at least 500 and at most 10,000.

where R, $R^1$, $R^2$, X, A, g, h, j, and k have the meanings assigned above.

The third main class of preferred such photopolymerisable epoxide resins are those containing, as the photopolymerisable groups, azidobenzoyloxy groups of the formula

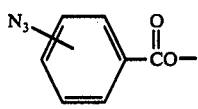 XXX especially those resins which are of the formula

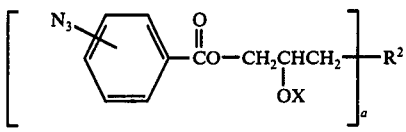 XXXI where X, a, and R² have the meanings previously assigned.

The novel epoxide resins of this invention are obtainable, according to another aspect of this invention, by reaction of an alcohol having, per average molecule, at least two, and preferably three or more, photopolymerisable groups and also at least one aliphatic secondary hydroxyl group present in a group of the formula

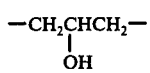 XXXII such that the indicated hydroxyl group is converted into a glycidyl ether group by a method known per se, preferably by reaction with epichlorohydrin in the presence of a hydrogen chloride acceptor (usually a strong base, such as sodium hydroxide) and preferably in the presence of a catalyst such as a quaternary ammonium compound, a tertiary amine, a thioether, or a sulphonium salt. The proportion of epichlorohydrin used is not critical, provided that at least one equivalent is used. However, it is particularly convenient to use epichlorohydrin as a solvent in the reaction, in which case an excess over the theoretical quantity is employed, usually a total of at least 3 moles per secondary hydroxyl group. The quaternary ammonium compound is preferably a tetra-alkylammonium halide, especially a tetra-lower alkyl-ammonium chloride or bromide, the lower alkyl groups each containing from one to four carbon atoms. Tetramethylammonium chloride is particularly preferred. Only a catalytic quantity of the quaternary ammonium compound or other catalyst is required, generally from 0.1 to 1% by weight of the secondary alcohol. Reaction is normally effected at a temperature in the range 30° to 120° C, preferably 40° to 65° C, and usually under reduced pressure in order to remove the water formed during the reaction.

Less conveniently, epichlorohydrin, or glycerol 1,2- or 1,3-dichlorohydrin, is condensed with the same starting material in the presence of a Lewis acid catalyst, and the product is dehydrochlorinated by means of a hydrogen chloride acceptor as above.

The secondary alcohols used to prepare the epoxide resins of this invention are, in general, known compounds.

Compounds of formula

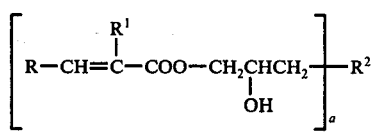 XXXIII where R, R¹, R², and a have the meanings assigned above, are described in our German Offenlengungsschrift No. 2,410,238.

Compounds of formula

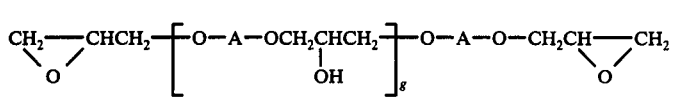 XXXIV where A and g have the meanings assigned above, are described in British Patent Specification No. 1,076,650.

Compounds of formula

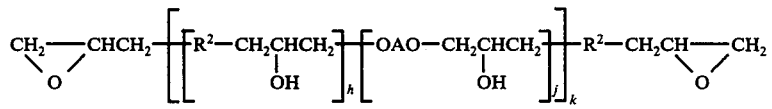 XXXV where R², h, A, j, and k have the meanings above, are described in U.S. Pat. No. 3,410,824 and in our Netherlands patent application No. 7,311,716.

Compounds of formula

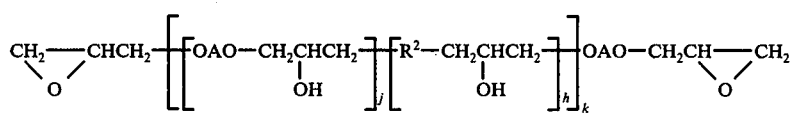 XXXVI where A, j, R², h, and k have the meanings assigned above, are described in our Netherlands patent application No. 7,311,716.

Compounds of the formulae

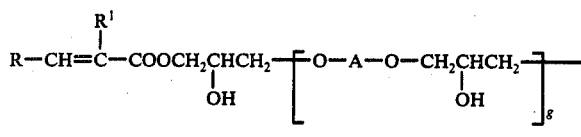

XXXVII

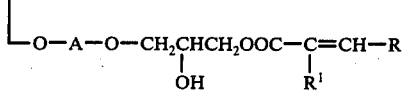

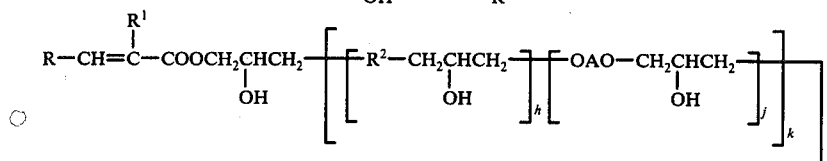

XXXVIII

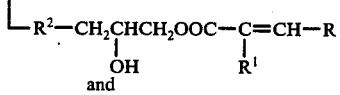

and

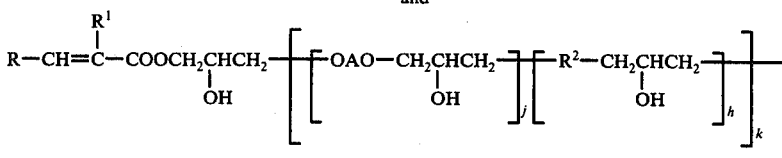

XXXIX

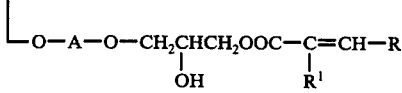

where R, R$^1$, A, g, h, j, and k have the meanings assigned above, are described in our German Offenlegungsschrift No. 2507008.

Compounds of formula

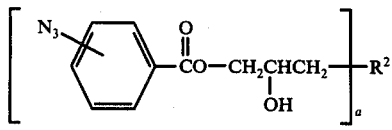

XL where a and R$^2$ have the meanings given above, are described in British patent specification No. 1330263.

Also provided is a process for photopolymerising an epoxide resin of this invention which comprises subjecting it to actinic radiation, preferably of wavelength 200 to 600 nm. The polymerised resin is then crosslinked through reaction of its epoxide groups.

As stated above, the resins of the present invention are of particular value in the production of multilayer printed circuits. A layer of the resin and a curing agent therefor is applied to a support by coating the support with a solution of the resin and its curing agent in any convenient solvent, e.g., cyclohexanone, 2-methoxyethanol, 1-acetoxy-2-ethoxyethane, toluene, acetone, or ethyl methyl ketone, or mixtures of any of these, and allowing or causing the solvent to evaporate; the layer may be applied by dipping, whirling, spraying, or by means of a roller.

The curing agent used may be of any of those conventionally used to effect heat-curing of epoxide resins, such as aromatic polyamines, acid anhydrides, polythiols, and complexes of tertiary amines with boron trifluoride or boron trichloride, and boron difluoride chelates; in order to give the coated plate a conveniently long shelf-life it is preferred to use a latent curing agent, i.e., one which has little or no effect at room temperature but which reacts rapidly once it has been heated above a certain "threshold" temperature. Dicyandiamide is particularly preferred.

Photopolymerisation of the epoxide resins of the present invention is sometimes accelerated by incorporation of a photosensitiser. Most substances known as photosensitisers in conventional processes involving actinically-induced polymerisation are suitable: their suitability is readily checked by routine experimentation. Photosensitisers are described in, for example, Kosar, "Light-sensitive Systems: Chemistry and Applications of Non-Silver Halide Photographic Processes", Wiley, New York, 1965, 473 pp. They fall into two main classes (a) those which, on irradiation, give an excited state that leads to formation of free radicals which then initiate polymerisation of the monomer (photoinitiators) and (b) those which, on irradiation, given an excited state which in turn transfers its excitation energy to a monomer molecule, giving rise to an excited monomer molecule which then crosslinks with an unexcited monomer molecule (photosensitisers).

The first class includes organic peroxides and hydroperoxides, α-substituted acetophenones such as 2,2,2-trichloro-4'-tert.-butylacetophenone, benzoyl phenyl carbinols and alkyl ethers thereof, such as benzoin and its alkyl ethers, benzophenones, benzil acetals, and mixtures of phenothiazine dyes or quinoxalines with electron donors such as sodium benzenesulphinate or thiourea (photoredox systems), these sensitisers being used with unsaturated esters, especially acrylates and methacrylates, and also acrylamides.

The second class includes 5-nitroacenaphthene, 4-nitroaniline, 2,4,7-trinitro-9-fluorenone, 3-methyl-1,3-diaza-1,9-benzanthrone, and bis(dialkylamino)benzophenones, especially Michler's ketone, i.e., bis(p-dimethylamino)benzophenone.

The photopolymerisation catalyst must not, of course, give rise to a substantial degree of photoinduced polymerisation through consumption of epoxide groups, nor must it react to a substantial extent with the epoxide groups. Those which are preferred are bis(-dialkylamino)-benzophenones, especially bis(p-dimethylamino)benzophenone, and benzoyl phenyl carbinols, especially benzoin, and alkyl ethers of such carbinols. When a photosensitiser is used, 0.1 to 20%, and particularly 0.5 to 15%, by weight is preferably incorporated into the coating solution, based on the weight of the photopolymerisable epoxide resin.

This invention also includes a plate sensitive to actinic radiation comprising a support, which may be of, for example, paper, copper, aluminium or other metal, synthetic resin, or glass, carrying a layer of such a resin and optionally a heat-curing agent for epoxide resins, also a support bearing upon its surface such a resin which has been photopolymerised by exposure to actinic radiation and which may have been heat-crosslinked. It also provides a method of polymerising such a resin, which comprises subjecting a plate carrying a layer of the resin to actinic radiation, optionally imagewise as through a negative, and removing the unpolymerised portions, if any, of the resin by means of a solvent.

The coating of the resin should be applied to the support so that, upon drying, its thickness will be in the range of from about 1 to 250 μm. The wet polymer coating may be dried by air drying or by any other known drying technique, and the polymerisable system may then be stored until required for use.

The polymerisable coatings can be insolubilised by exposure to actinic radiation through an image-bearing transparency consisting of substantially opaque and transparent areas. Suitable sources of actinic radiation include carbon arcs, mercury vapour arcs, fluorescent lamps with phosphors emitting ultra-violet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of the resin will depend upon a variety of factors which include, for example, the individual resin being utilised, the thickness of the coating, the type of light source, and its distance from the coating.

Subsequent to their exposure the coatings are "developed" by being washed with a suitable liquid, such as perchloroethylene, methylene chloride, ethylene dichloride, acetone, ethyl methyl ketone, cyclohexanone, n-propanol, ethanol, toluene, benzene, ethyl acetate, and mixtures thereof, to dissolve and remove that portion of the coating which was not polymerised by exposure to actinic radiation. Liquids used for this operation must be selected with care since they should have good solvent action on the unexposed areas yet have little effect upon either the polymerised ester or the substrate. The developing solvent should normally be allowed to remain in contact with the coating for from about 30 seconds to 3 minutes, depending upon which solvent is utilised. The developed polymer coating should next be rinsed with fresh solvent and dried.

In the production of printed circuits where the support is of copper or of other suitable electrically-conducting metal, the exposed metal can be etched in a conventional manner, using ferric chloride or ammonium persulphate solutions, for example.

This invention also includes a process for the preparation of multilayer printed circuits which comprises coating plates bearing a layer of metal, especially copper, with a layer of a photopolymerisable epoxide resin of this invention, optionally containing a heat-curing agent for epoxide resins, exposing it to actinic radiation imagewise as through a negative, removing the unpolymerised portions of the resin by means of a solvent, etching the exposed metal, stacking the plates alternately with insulating layers, and crosslinking the resin by heat. If the heat-curing agent is not admixed with the layer of photopolymerisable resin, it is incorporated in the insulating layers which alternate with the plates, these insulating layers conveniently being of an epoxide resin prepreg: sufficient of the heat-curing agent contained in the prepreg, provided the prepreg is not too thick, migrates to induce crosslinking of the photopolymerised epoxide resin. The temperature at which the epoxide resin is heated will depend on the nature of the epoxide resin and its curing agent. Generally, temperatures in the range of 100° to 200° C, and especially 140° to 185° C, are preferred.

The following Examples illustrate the invention. All parts are by weight and temperatures are in degrees Celsius. Unless otherwise indicated, the epoxide contents were determined by potentiometric titration against 0.1 N-perchloric acid in glacial acetic acid in the presence of tetraethylammonium bromide, using glass and lithium chloride electrodes.

The starting materials were prepared as follows:

Product A

An epoxide resin, prepared by the glycidylation of 2,2-bis(p-hydroxyphenyl)propane and having an epoxide content of 5.4 equiv./kg, i.e., substantially 2,2-bis(-glycidyloxyphenyl)propane, (160 g), was mixed with 1,5-bis(hydroxyphenyl)penta-1,4-dien-3-one (100 g), tetraethylammonium bromide (0.4 g), and dioxane (400 g). The mixture was heated under reflux and the solvent was removed by evaporation under reduced pressure to leave a resin (Product A) having an epoxide group content of 0.45 equiv./kg.

Product B

N,N'-Diglycidyl-5,5-dimethylhydantoin having an epoxide content of 8.1 equiv./kg (100 g), 1,5-bis(p-hydroxyphenyl)penta-1,4-dien-3-one (100 g), tetramethylammonium chloride (0.5 g), 1-acetoxy-2-ethoxyethane (175 g), and 2-methoxyethanol (225 g) were mixed together and heated at 130° for 8 hours. The solvents were evaporated under reduced pressure to leave a resin (Product B) having an epoxide content of 0.3 equiv./kg.

Product C

N,N'-Diglycidyl-5,5-dimethylhydantoin having an epoxide content of 8.1 equiv./kg (40 g), 1,5-bis(p-hydroxyphenyl)penta-1,4-dien-3-one (43.1 g), tetramethylammonium chloride (0.2 g), 1-acetoxy-2-ethoxyethane (70 g), and 2-methoxyethanol (90 g) were mixed together and heated at 130° for 15 hours. The solvents were evaporated under reduced pressure to leave a resin (Product C) having an epoxide content of 0.1 equiv./kg.

Product D

N,N'-Diglycidyl-5,5-dimethylhydantoin having an epoxide content of 8.1 equiv./kg (44 g), 1,5-bis(p-hydroxyphenyl)penta-1,4-dien-3-one (40 g), tetramethylammonium chloride (0.2 g), 1-acetoxy-2-ethoxyethane (70 g), and 2-methoxyethanol (90 g) were mixed together and heated at 130° for 8 hours. The solvents were evaporated under reduced pressure to leave a resin (Product D) having an epoxide content of 0.5 equiv./kg.

Product E

N,N'-Diglycidyl-5,5-dimethylhydantoin having an epoxide content of 8.1 equiv./kg (100 g), 1,5-bis(p-hydroxyphenyl)penta-1,4-dien-3-one (107.7 g), tetramethylammonium chloride (0.6 g), and 2-ethoxyethanol (311.6 g), were mixed together and heated at 120° for 10 hours. The resultant solution (having a 40% resin content) had a viscosity of 1090 mPas (millipascal seconds) at 25°.

The solution was evaporated under reduced pressure to leave a resin (Product E) having an epoxide content of 0.16 equiv./kg.

Product F

An epoxy novolak resin having an epoxide content of 5.6 equiv./kg and being a polyglycidyl ether of a phenol-formaldehyde novolak of number average molecular weight 420 (100 g), 2,2-bis(4-hydroxyphenyl)-propane (22.9 g), sorbic acid (33.4 g), hydroquinone (0.15 g), tetramethylammonium chloride (0.5 g), and toluene (157 g) were mixed together and heated under reflux for 7 hours.

The solution was evaporated under reduced pressure to leave a resin (Product F) having an epoxide content of 0.78 equiv./kg.

Product G 1,3-bis(5,5-Dimethyl-3-glycidylhydantoin-1-yl)-2-glycidyloxypropane (100 g), 0.3 g of tetramethylammonium chloride, and 0.2 g of hydroquinone were stirred at 120°, whilst 43.9 g of acrylic acid was added over 30 minutes. The mixture was stored at 120° for a further 1 hour, by which time its epoxide content was 0.51 equiv./kg.

Product H

The epoxy novolak described in Product F (8.7 g), 1-(2-furyl)-3-(4-hydroxyphenyl)prop-1-en-3-one (10 g), tetramethylammonium chloride (0.05 g), and toluene (80.3 g) were mixed together and heated under reflux for 10 hours. The toluene was then removed under reduced pressure to leave Product H which had an epoxide content of 0.27 equiv./kg.

EXAMPLE 1

Product A (50 g), epichlorohydrin (312 g), and a solution of tetramethylammonium chloride (1.5 g) in water (1.5 g) were heated together under reduced pressure so that the mixture refluxed at 55°. A solution of sodium hydroxide (5.9 g) in water (6.0 g) was added over 2 hours, and the mixture was heated under reflux at 55° for a further 1½ hours, water being removed continuously.

The mixture was cooled to room temperature and filtered, and the filtrate was washed with 5% aqueous solution of sodium dihydrogen orthophosphate and then with water. The organic solution was dried over magnesium sulphate and the excess of epichlorohydrin was removed by distillation under reduced pressure. The product, which had an epoxide content of 2.0 equiv./kg (measured using crystal violet as indicator), was dissolved in cyclohexanone to give a solution having a 40% resin content.

EXAMPLE 2

Example 1 was repeated, starting from the following: Product B (100 g), epichlorohydrin (600 g), tetramethylammonium chloride (0.5 g) in water (1 g), and sodium hydroxide (14 g) in water (14 g).

The product, which had an epoxide content of 1.9 equiv./kg, was dissolved in a 2-methoxyethanol/1-acetoxy-2-ethoxyethane mixture (1:1.3) to give a solution having a 33% resin content.

EXAMPLE 3

Example 1 was repeated, starting from the following: Product C (33.3 g), epichlorohydrin (500 g), a solution of tetramethylammonium chloride (0.2 g) in water (0.5 g), and a solution of sodium hydroxide (4.7 g) in water (5 g).

The product, which had an epoxide content of 1.6 equiv./kg, was dissolved in cyclohexanone to give a solution having a 25% resin content.

EXAMPLE 4

Example 1 was repeated, starting from the following: Product D (200 g), epichlorohydrin (800 g), tetramethylammonium chloride (1 g) in water (1 g), and a solution of sodium hudroxide (28 g) in water (28 g).

The product, which had an epoxide content of 1.5 equiv./kg, was dissolved in cyclohexanone to give a solution having a 30% resin content.

EXAMPLE 5

Example 1 was repeated, starting from the following: Product E (200 g), epichlorohydrin (800 g), tetramethylammonium chloride (1 g) in water (1 g), and a solution of sodium hydroxide (28.25 g) in water (28 g).

The product, which had an epoxide content of 2.3 equiv./kg, was dissolved in 2-ethoxyethanol to give a solution having a 40% resin content. This solution had a viscosity at 22° of 325 mPas.

EXAMPLE 6

Products A and E were dissolved in dioxan and 2-ethoxyethanol respectively to give 40% solutions. Products B, C, and D were dissolved in 1:1.3 mixtures of 1-acetoxy-2-ethoxyethane and 2-methoxyethanol to give 34% solutions. These solutions, and the resin solutions from Examples 1 to 5, were treated as follows:

Dicyandiamide was dissolved in the solutions and they were coated onto a piece of polytetrafluoroethylene sheet, using a whirler coater. The coated sheets were dried in an oven at 80° for 10 minutes, then irradiated for 10 minutes with a 500 w medium pressure mercury lamp at a distance of 25 cm to effect ultra-violet cure. The plates were next heated in an oven at 180° for 1 hour to effect thermal cure of the epoxide groups. The glass transition temperatures (Tg) of the final cured films were then determined by thermochemical analysis, using a Perkin-Elmer TMS-1 Thermomechanical Analyzer with a penetration probe. The results are shown in Table I.

TABLE I

| Product | Resin from Example | Dicyandiamide (parts per 100 parts resin) | Tg (° C) |
|---|---|---|---|
| A | — | 2 | 131 |
| — | 1 | 4 | 151 |
| B | — | 2 | 103 |
| — | 2 | 4 | 129 |
| C | — | 2 | 90 |
| — | 3 | 4 | 123 |
| D | — | 2 | 102 |
| — | 4 | 4 | 147 |
| E | — | 2 | 95 |
| — | 5 | 4 | 140 |

Hence it may be seen that the products from the Examples all had higher transition temperatures than the materials from which they were prepared.

EXAMPLE 7

The resin solutions from Examples 1 and 4, and solutions of their starting materials, Products A and D, prepared as described in Example 6, were treated as follows:

Dicyandiamide was dissolved in the resin solutions and they were coated onto a piece of polytetrafluoroethylene sheet, using a whirler coater. The sheet was heated at 80° for 10 minutes and irradiated with a 500 w metal halide lamp until light-induced cure was complete, heated overnight in a vacuum oven at 50°, and then heat-cured at 180° C for 1 hour. The glass transition temperatures were then measured by differential scanning calorimetry (DSC) using the Perkin-Elmer instrument and by differential thermal analysis (DTA), using a Mettler instrument. The results are given in Table II.

TABLE II

| Product | Resin from Example | Dicyandiamide (parts per 100 parts resin) | Tg (° C) DTA | Tg (° C) DSC |
|---|---|---|---|---|
| A | — | 2 | 128 | 117 |
| — | 1 | 4 | 165 | 157 |
| D | — | 2 | 125 | 110 |
| — | 4 | 4 | 158 | 156 |

As in Example 6, the results show that the products from the Examples had higher transition temperatures than the resins from which they were prepared.

EXAMPLE 8

Example 1 was repeated, starting from the following:
Product F (125 g), epichlorohydrin (500 g), tetramethylammonium chloride (0.6 g) in water (1 g), and a solution of sodium hydroxide (15.9 g) in water (16 g).

The product had an epoxide content of 2.33 equiv./kg and this was dissolved in 2-ethoxyethanol to give a solution having a 50% resin content.

EXAMPLE 9

Product F was dissolved in a 2:1 mixture of toluene and acetone to give a 40% solution. To this solution, and the resin solution from Example 8, were added 1% of Michler's ketone and dicyandiamide (2 and 4 parts, respectively, per 100 parts of resin).

The solutions were coated onto polytetrafluoroethylene sheets, using a whirler coater, and dried in an oven at 80° for 10 minutes. They were then irradiated for 10 minutes with a 500 W medium pressure mercury lamp at a distance of 25 cm to effect ultra-violet cure, and finally heated in an oven at 180° for 1 hour to effect thermal cure. The glass transition temperatures of Product F and the product of Example 8 were 85.5° and 99° respectively.

EXAMPLE 10

Example 1 was repeated, starting from the following:
Product G (136 g), epichlorohydrin (266 g), tetramethylammonium chloride (0.6 g) in water (1 g), and a solution of sodium hydroxide (23.05 g) in water (23 g).

The product, which had an epoxide content of 2.15 equiv./kg, was dissolved in 2-ethoxyethanol to give a 40% solution.

EXAMPLE 11

Product G was dissolved in 2-ethoxyethanol to give a 40% solution. To this solution, and the resin solution from Example 10, were added 1% of benzil dimethyl acetal and dicyandiamide (2 and 4 parts, respectively, per 100 parts of resin). The solutions were coated onto polytetrafluoroethylene sheets, using a whirler coater, and dried in an oven at 80° for 10 minutes. They were then irradiated for 10 minutes with a 500W medium pressure mercury lamp at a distance of 25 cm to effect ultra-violet cure, and finally heated in an oven at 180° for 1 hour to effect thermal cure. The glass transition temperatures of product G and the product of Example 10, determined by DTA, were 44° and 55° respectively.

EXAMPLE 12

Example 1 was repeated, starting from the following:
Product H (16.7 g), epichlorohydrin (200 g), tetramethylammonium chloride (0.1 g), and a solution of sodium hydroxide (2.1 g) in water (6.0g).

The product, the epoxide content of which was 3.16 equiv./kg. was dissolved in a 3:1 mixture of 2-ethoxyethanol and cyclohexanone to give a 40% solution.

EXAMPLE 13

Product H was dissolved in 2-ethoxyethanol to give a 40% solution. To this solution, and the resin solution from Example 12, was added dicyandiamide (2 and 4 parts, respectively, per 100 parts of resin).

The solutions were coated onto polytetrafluoroethylene sheets, using a whirler coater, and dried in an oven at 80° for 10 minutes. They were then irradiated for 10 minutes with a 500W medium pressure mercury lamp at a distance of 25 cm to effect ultra-violet cure, and finally heated in an oven at 180° for 1 hour. The glass transition temperatures of Product H and the product of Example 12 (as determined by DTA) were 95° and 130° respectively.

I claim:

1. Epoxide resins which polymerise on exposure to actinic radiation, having, per average molecule, at least two photopolymerisable groups and also at least two 1,2-epoxide groups, one or more such epoxide groups being contained in units of formula

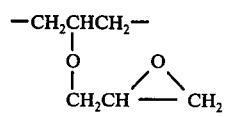

2. Epoxide resins according to claim 1, having an average molecular weight of from 500 to 10,000.

3. Epoxide resins according to claim 1, in which the units of formula I are linked to carbon atoms in the remainder of the molecule through oxygen, nitrogen, or sulfur atoms.

4. Epoxide resins according to claim 1, in which the photopolymerisable groups are of the formula $$R-CH=\underset{R^1}{C}-CO- \qquad \text{II}$$

where
- R represents a hydrogen atom or an aliphatic, aromatic, araliphatic, or heterocyclic group of 1 to 12 carbon atoms, and
- $R^1$ represents a hydrogen, chlorine, or bromine atom, an alkyl group of 1 to 4 carbon atoms, or a cyano group.

5. Epoxide resins according to claim 4, in which the group R contains ethylenic unsaturation or aromaticity in conjugation with the indicated ethylenic double bond.

6. Epoxide resins according to claim 4, in which the group of formula II are directly attached to oxygen atoms or nitrogen atoms.

7. Epoxide resins according to claim 6, which are of the formula $$\left( R-CH=\underset{R^1}{C}-CO-OCH_2\underset{OX}{CHCH_2}- \right)_a R^2$$

where
- R represents a hydrogen atom or an aliphatic, aromatic, araliphatic or heterocyclic group of 1 to 13 carbon atoms,
- $R^1$ represents a hydrogen, chlorine, or bromine atom, an alkyl group of 1 to 4 carbon atoms, or a cyano group,
- $R^2$ represents the residue of a polyglycidyl compound after removal of glycidyl groups directly attached to oxygen, nitrogen, or sulfur atoms, the said residue being linked through oxygen, nitrogen, or sulfur atoms thereof to the indicated groups,
- a represents an integer of at least 2, and
- X represents a hydrogen atom or a glycidyl group, such that at least one group X is a glycidyl group.

8. Epoxide resins according to claim 7, in which the group $R^2$ is linked to the other indicated groups through ether oxygen atoms.

9. Epoxide resins according to claim 7, in which the group $R^2$ is linked to the other indicated groups through amidic nitrogen atoms.

10. Epoxide resins according to claim 9, in which the amidic nitrogen atoms are those of a cyclic urea.

11. Epoxide resins according to claim 1, in which the photopolymerisable groups are of the formula

XII

-continued

XIII

XIV

XV the units of formulae XII to XV being linked by one indicated free valence through an oxygen atom to a carbon atom and by the other free valence either through another oxygen atom to another carbon atom or direct to a hydrogen atom, where
- each $R^3$ is a halogen atom or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing up to 9 carbon atoms, a nitro group, or a carboxyl, sulfonic, or phosphoric acid group in the form of a salt,
- b represents zero or an integer of 1 to 4,
- c represents zero or an integer of 1 to 5,
- d represents zero or an integer of 1 to 3,
- Y represents a chain of carbon atoms containing in that chain a grouping of formula $$\left[ CH=\underset{R^4}{C} \right]_e \overset{O}{\underset{\parallel}{C}} \left[ \underset{R^5}{C}=CH \right]_f$$

or $$-\overset{O}{\underset{\parallel}{C}}-\underset{R^6}{C}=CH-\underset{}{\bigcirc}-CH=\underset{R^7}{C}-\overset{O}{\underset{\parallel}{C}}-$$

or $$-CH=\underset{R^6}{C}-\overset{O}{\underset{\parallel}{C}}-\underset{}{\bigcirc}-\overset{O}{\underset{\parallel}{C}}-\underset{R^7}{C}=CH-$$

- $R^4$ and $R^5$ are each individually a hydrogen atom, an alkyl group, or an aryl group, or $R^4$ and $R^5$ conjointly denote a polymethylene chain of 2 to 4 methylene groups,
- $R^6$ and $R^7$ are each a hydrogen atom, an alkyl group, or an aryl group,
- e and f are each zero, 1, or 2, with the proviso that they are not both zero, and
- Z is an oxygen or sulfur atom.

12. Epoxide resins according to claim 11, which are of the formula

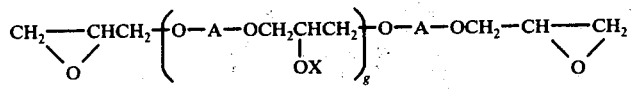

where
A denotes a group of any of formula XII to XV in claim 11,
X represents a hydrogen atom or a glycidyl group such that at least one group X is a glycidyl group, and
g is a positive integer of average value such that the average molecular weight of the epoxide resin is at least 500 and at most 10,000.

13. Epoxide resins according to claim 11, which are

A denotes a group of any of formulae XII to XV in claim 11,
X represents a hydrogen atom or a glycidyl group such that at least one group X is a glycidyl group,
h is zero or a positive integer, and
j and k are each an integer of one or more,
h, j, and k being such that the average molecular weight of the epoxide resin is from 5000 to 10,000.

14. Epoxide resins according to claim 11, which are of the formula

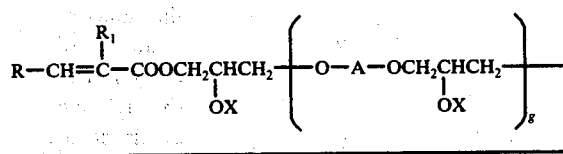

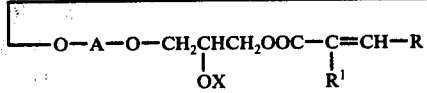

or

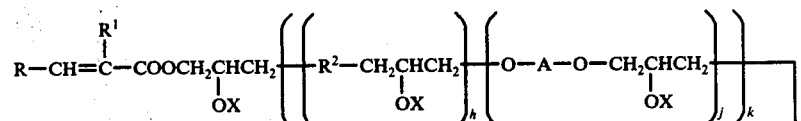

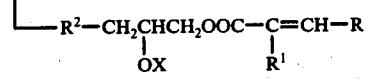

or

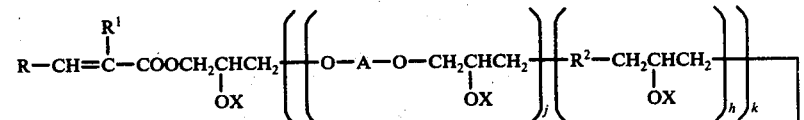

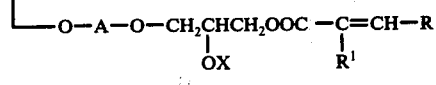

of the formula

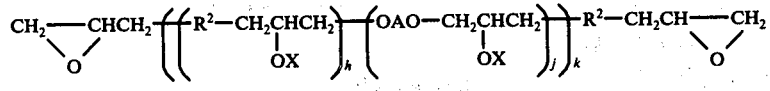

or

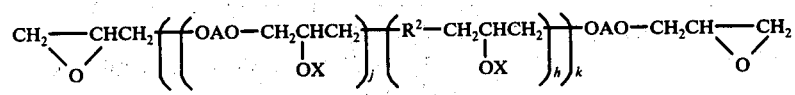

where
R² represents the residue of a polyglycidyl compound after removal of glycidyl groups directly attached to oxygen, nitrogen, or sulfur atoms, the said residue being linked through oxygen, nitrogen, or sulfur atoms thereof to the indicated groups, R represents a hydrogen atom or an aliphatic, aromatic, araliphatic, or heterocyclic group of 1 to 13 carbon atoms,
R¹ represents a hydrogen, chlorine, or bromine atom, an alkyl group of 1 to 4 carbon atoms, or a cyano group, A denotes any group of formulae XII to XV in claim 11, g is a positive integer of average value such that the average molecular weight of the epoxide resin is at least 500 and at most 10,000 h is zero or a positive integer, and j and k are each an integer of one or more, h, j and k being such that the average molecular weight of the epoxide resin is from 500 to 10,000.

15. Epoxide resins according to claim 1, in which the photopolymerisable groups are of the formula

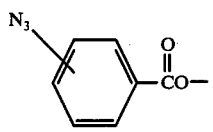

16. Epoxide resins according to claim 15, which are of the formula

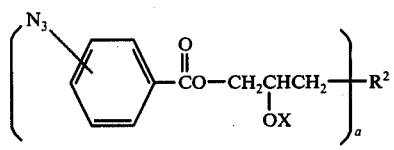

where

X represents a hydrogen atom or a glycidyl group, such that at least one group X is a glycidyl group, a represents an integer of at least 2, and $R^2$ represents the residue of a polyglycidyl compound after removal of glycidyl groups directly attached to oxygen, nitrogen, or sulfur atoms, the said residue being linked through oxygen, nitrogen or sulfur atoms thereof to the indicated groups.

17. A plate, sensitive to actinic radiation, comprising a support coated with a layer of an epoxide resin as claimed in claim 1.

18. A plate as claimed in claim 17, in which a sensitiser is present in the layer of the epoxide resin.

19. A plate as claimed in claim 18, in which the photosensitiser is a bis(dialkylamino)benzophenone, a benzoyl phenyl carbinol, or an alkyl ether of a benzoyl phenyl carbinol.

20. A plate as claimed in claim 17, in which a heat-curing agent for the epoxide resin is present in the layer of the epoxide resin.

21. A plate as claimed in claim 20, in which the curing agent is an aromatic polyamine, an acid anhydride, a polythiol, dicyandiamide, a complex of a tertiary amine with boron trifluoride or boron trichloride or is a boron difluoride chelate.

22. A process of photopolymerising an epoxide resin as claimed in claim 1 which comprises subjecting it to actinic radiation.

23. The process of claim 22, in which the radiation has a wavelength of 200 to 600 nm.

24. The process of claim 22, in which a plate coated with a layer of epoxide resin is subjected to actinic radiation, optionally imagewise as through a negative, and any unpolymerised portions of the resin are removed by means of a solvent.

25. The process of claim 22, in which the epoxide resin is subjected to actinic radiation in the presence of a photosensitiser.

26. The process of claim 25, in which the photosensitiser is a bis(dialkylamino)benzophenone, a benzoyl phenyl carbinol, or an alkyl ether of a benzoyl phenyl carbinol.

27. The process of claim 22, in which the epoxide resin is, after photopolymerisation, crosslinked through reaction of its epoxide groups with a curing agent.

28. The process of claim 27, in which crosslinking of the photopolymerised resin is carried out at a temperature in the range 100° to 200° C.

29. The process of claim 27, in which the curing agent is an aromatic amine, an acid anhydride, a polythiol, dicyandiamide, a complex of a tertiary amine with boron trifluoride or boron trichloride, or is a boron difluoride chelate.

30. A process for preparation of multilayer printed circuits which comprises coating a layer of metal with a layer of photopolymerisable epoxide resin as claimed in claim 1, exposing the resin to actinic radiation imagewise through a negative, removing the unpolymerised portions of the resin by means of a solvent, etching the exposed metal, stacking the plates alternately with insulating layers, an effective amount of a heat-curing agent for epoxide resins being contained either in the layer of the said photopolymerisable epoxide resin or in the said insulating layers, and crosslinking the resin by heat.

31. The process of claim 30, in which the photopolymerisable epoxide resin is exposed to actinic radiation in the presence of a photosensitiser.

32. The process of claim 31 in which the photosensitiser is a bis(dialkylamino)benzophenone, a benzoyl phenyl carbinol, or an alkyl ether of a benzoyl phenyl carbinol.

33. The process of claim 30, in which the photopolymerised resin is crosslinked at a temperature in the range 100° to 200° C.

34. The process of claim 30, in which the photopolymerised resin is crosslinked by means of an aromatic polyamine, an acid anhydride, a polythiol, dicyandiamide, a complex of a tertiary amine with boron trifluoride or boron trichloride or a boron difluoride chelate.

35. Printed circuits made by the process of claim 30.

* * * * *